United States Patent
Chen et al.

(10) Patent No.: US 11,175,192 B2
(45) Date of Patent: Nov. 16, 2021

(54) SENSOR ASSEMBLY HAVING AN OVERLOAD STOP

(71) Applicant: Measurement Specialties, Inc., Hampton, VA (US)

(72) Inventors: Ya-Mei Chen, Fremont, CA (US); James Hoffman, Santa Clara, CA (US)

(73) Assignee: MEASUREMENT SPECIALTIES, INC., Hampton, VA (US)

( * ) Notice: Subject to any disclaimer, the term of this patent is extended or adjusted under 35 U.S.C. 154(b) by 229 days.

(21) Appl. No.: 16/577,094

(22) Filed: Sep. 20, 2019

(65) Prior Publication Data

US 2021/0088391 A1  Mar. 25, 2021

(51) Int. Cl.
  *G01L 1/18* (2006.01)

(52) U.S. Cl.
  CPC ........ *G01L 1/18* (2013.01); *B81B 2201/0264* (2013.01)

(58) Field of Classification Search
  CPC ...... B81B 2201/0264; G01L 1/18; G01L 1/26
  See application file for complete search history.

(56) References Cited

U.S. PATENT DOCUMENTS

| | | | | |
|---|---|---|---|---|
| 4,454,771 A | * | 6/1984 | Shimazoe | G01L 1/18 73/777 |
| 4,891,985 A | * | 1/1990 | Glenn | G01L 1/18 73/514.33 |
| 5,184,107 A | | 2/1993 | Maurer | |
| 7,726,197 B2 | | 6/2010 | Selvan et al. | |
| 9,003,897 B2 | | 4/2015 | Wade et al. | |
| 9,902,611 B2 | | 2/2018 | Brosh et al. | |
| 10,036,676 B1 | | 7/2018 | Bradley et al. | |
| 2007/0251328 A1 | | 11/2007 | Selvan et al. | |
| 2010/0319459 A1 | * | 12/2010 | Rebeaud | G04G 21/02 73/715 |
| 2013/0068022 A1 | * | 3/2013 | Jeung | G01L 9/0048 73/514.29 |
| 2014/0007705 A1 | | 1/2014 | Campbell et al. | |
| 2017/0158488 A1 | * | 6/2017 | Brown | G01L 9/0055 |

FOREIGN PATENT DOCUMENTS

| | | | | |
|---|---|---|---|---|
| CH | 701334 A2 | * | 12/2010 | ............ G01L 7/082 |
| CN | 202675639 U | * | 1/2013 | |
| RU | 2564376 C1 | * | 9/2015 | |

\* cited by examiner

*Primary Examiner* — Francis C Gray

(57) ABSTRACT

A sensor assembly includes a sensor and an overload stop disposed on a surface of the sensor. The sensor has a resilient central region and an outer region surrounding the central region. The overload stop includes a center stop disposed on the central region and a peripheral stop disposed on the outer region.

22 Claims, 5 Drawing Sheets

SENSOR ASSEMBLY HAVING AN OVERLOAD STOP

FIELD OF THE INVENTION

The present invention relates to a sensor assembly and, more particularly, to a sensor assembly having an overload stop.

BACKGROUND

A deflectable sensor membrane can be used as a force sensor. An applied force causes a deflection of the sensor membrane. The sensor membrane is a piezoresistive device having a resistance that changes in accordance with the deflection. The change in resistance produces a differential voltage that corresponds to the deflection and the applied force, and the sensor membrane thereby outputs an electrical signal representative of the applied force.

Generally, to receive the applied force and transmit the applied force to deflect the sensor membrane, an intermediate element is positioned on the deflectable sensor membrane. A contact point between the intermediate element and the sensor membrane, however, can move along the surface of the sensor membrane and is difficult to control, which can lead to inaccurate deflection and consequently inaccurate measurements of the applied force. Further, as the applied force increases, the deflectable sensor membrane can continue to deflect even past a point of maximum permissible deflection, which can lead to damage of the membrane, inaccurate measurements, and replacement costs.

SUMMARY

A sensor assembly includes a sensor and an overload stop disposed on a surface of the sensor. The sensor has a resilient central region and an outer region surrounding the central region. The overload stop includes a center stop disposed on the central region and a peripheral stop disposed on the outer region.

BRIEF DESCRIPTION OF THE DRAWINGS

The invention will now be described by way of example with reference to the accompanying Figures, of which.

DETAILED DESCRIPTION OF THE EMBODIMENT(S)

Figure 1:
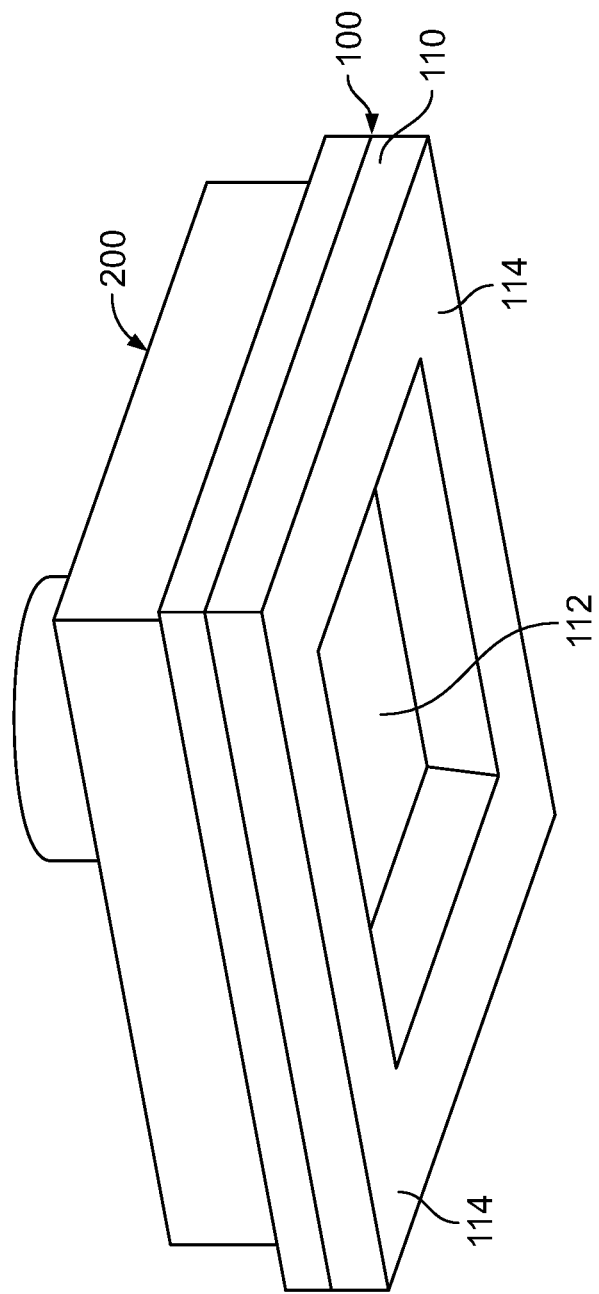
FIG. 1 is a perspective view of a sensor assembly according to an embodiment with an actuation element.

Exemplary embodiments of the present disclosure will be described hereinafter in detail with reference to the attached drawings, wherein like reference numerals refer to like elements. The present disclosure may, however, be embodied in many different forms and should not be construed as being limited to the embodiment set forth herein; rather, these embodiments are provided so that the present disclosure will convey the concept of the disclosure to those skilled in the art. In addition, in the following detailed description, for purposes of explanation, numerous specific details are set forth in order to provide a thorough understanding of the disclosed embodiments. However, it is apparent that one or more embodiments may also be implemented without these specific details.

Figure 2:
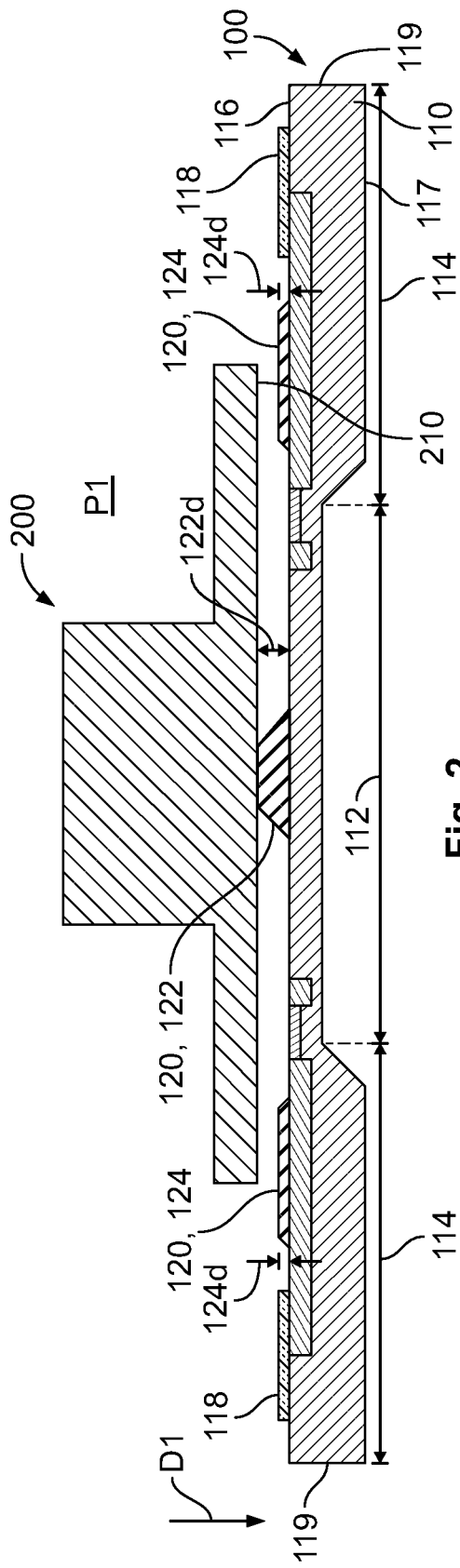
FIG. 2 is a sectional side view of the sensor assembly with the actuation element in a first position.
Figure 3:
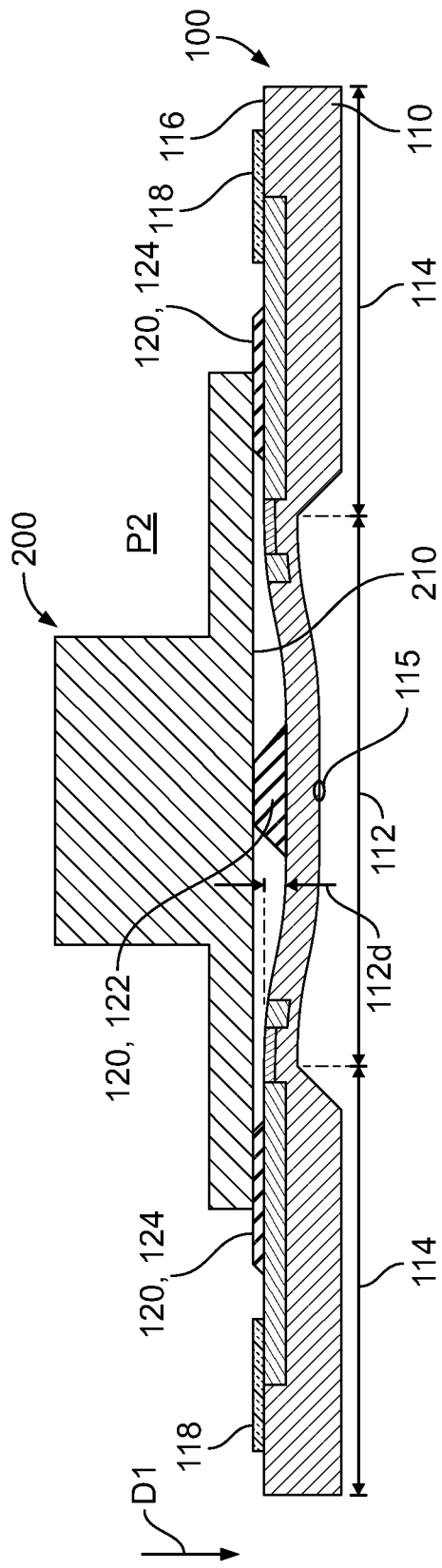
FIG. 3 is a sectional side view of the sensor assembly with the actuation element in a second position.

A sensor assembly 100 according to an embodiment of the invention is shown with an actuation element 200 in FIGS. 1-3. The sensor assembly 100 comprises a sensor 110 and an overload stop 120 disposed on the sensor 110.

The sensor 110, as shown in FIGS. 1-3, has a central region 112 and an outer region 114 surrounding the central region 112. The central region 112 resiliently deflects under an applied force in a deflection direction D1 shown in FIGS. 2 and 3; the central region 112 may also be referred to herein as a resilient central region 112. The outer region 114 is thicker than the central region 112 in the direction D1 and has a rigidity greater than a rigidity of the central region 112. The central region 112 has a maximum deflection 112$d$ in the direction D1, shown in FIG. 3, beyond which further deflection of the central region 112 results in damage to the sensor 110. The maximum deflection 112$d$ occurs at a position of maximum deflection 115, which is at a center of the central region 112.

The sensor 110 is a piezoresistive device having a resistance that changes in accordance with a mechanical deformation applied to the sensor 110. In the shown embodiment, the sensor 110 is a piezoresistive force sensor die that produces a differential voltage corresponding to a deflection of the central region 112 in the deflection direction D1 under an applied force.

As shown in FIGS. 2 and 3, the sensor 110 has a surface 116 and an electrical pad 118 disposed on the surface 116. The electrical pad 118 is disposed on the surface 116 at the outer region 114 and is formed of a conductive material. The differential voltage produced by the deflection of the central region 112 can be output from the sensor 110 through the electrical pad 118. The sensor 110 has a bottom 117 opposite the surface 116 in the deflection direction D1 and a pair of sides 119 between the surface 116 and the bottom 117 and extending in the deflection direction D1.

The overload stop 120 as shown in FIGS. 2 and 3, is disposed on the surface 116 of the sensor 110 and includes a center stop 122 and a peripheral stop 124. The center stop 122 is disposed on the central region 112 and the peripheral stop 124 is disposed on the outer region 114. The center stop 122 is disposed at the position of maximum deflection 115 of the central region 112. As shown in FIG. 2, the center stop 122 protrudes by a first distance 122$d$ from the surface 116 and the peripheral stop 124 protrudes by a second distance 124$d$ from the surface 116. The first distance 122$d$ is greater than the second distance 124$d$. In an embodiment, the center stop 122 and the peripheral stop 124 are each formed of an insulating material. In another embodiment, the center stop 122 and the peripheral stop 124 are each formed of a conductive material.

In the embodiment shown in FIGS. 2 and 3, the overload stop 120 is formed on the surface 116 by depositing a material on the surface 116. In an embodiment, the center stop 122 and the peripheral stop 124 are each formed of a plurality of film layers which are deposited on the surface 116. In various embodiments, the film layers forming the center stop 122 and the peripheral stop 124 can be applied using plasma-enhanced chemical vapor deposition (PECVD) or a 3D printing process. The deposition of the overload stop 120 in a plurality of film layers fixes the overload stop 120 to the surface 116 and dictates the first distance 122d and the second distance 124d by the number of film layers deposited. In various embodiment, the center stop 122 and the peripheral stop 124 are each formed of a plurality of layers of an insulating material such as silicon dioxide. In another embodiment, the center stop 122 and the peripheral stop 124 are each formed of a plurality of layers of a conductive material.

The use of the sensor assembly 100 to measure the applied force imparted by the actuation element 200 will now be described in greater detail with reference to FIGS. 2 and 3. The actuation element 200, as shown in FIGS. 2 and 3, has an actuation surface 210 positioned to face the surface 116 of the sensor 110. The actuation element 200 is movable under an applied force between a first position P1 and a second position P2 along the deflection direction D1.

In the first position P1, shown in FIG. 2, the actuation element 200 has not received the applied force; the central region 112 of the sensor 110 is not deflected and a voltage output from the sensor 110 indicates that the actuation element 200 has not received the applied force.

As the actuation element 200 receives the applied force, the actuation element 200 moves from the first position P1 toward the second position P2 shown in FIG. 3. The actuation surface 210 contacts the center stop 122 during movement from the first position P1 toward the second position P2 and, after making initial contact with the center stop 122, further movement of the actuation element 200 in the deflection direction D1 deflects the central region 112 at the position of maximum deflection 115. The fixed position of the center stop 122 ensures that the central region 112 is deflected at the position of maximum deflection 115 when the actuation element 200 is between the first position P1 and the second position P2 to accurately measure the force applied to the actuation element 200. The center stop 122 and the peripheral stop 124 each have a rigidity greater than a rigidity of the central region 112; the center stop 122 and the peripheral stop 124 do not deflect under an applied force sufficient to deflect the central region 112. When the actuation element 200 is positioned between the first position P1 and the second position P2, the deflection of the central region 112 corresponds to the applied force received by the actuation element 200.

The second position P2, shown in FIG. 3, corresponds to the maximum deflection 112d of the central region 112. When the actuation element 200 receives an applied force sufficient to reach the second position P2, the actuation surface 210 contacts the peripheral stop 124 in addition to the center stop 122. The contact of the actuation surface 210 with the peripheral stop 124 disposed on the more rigid outer region 114 braces the actuation element 200 and prevents further deflection of the central region 112.

As shown in FIGS. 2 and 3, a maximum deflection of the central region 112 permitted by the overload stop 120 is equal to a difference between the first distance 122d and the second distance 124d. In the shown embodiment, the difference between the first distance 122d and the second distance 124d is equal to the maximum deflection 112d of the central region 112 at the second position P2; the deflection of the central region 112 will not increase from the maximum deflection 112d even if an applied force on the actuation element 200 increases from the second position P2. The overload stop 120 consequently prevents an excessive applied force on the actuation element 200 from damaging the central region 112. In other embodiments, the difference between the first distance 122d and the second distance 124d may be less than the maximum deflection 112d.

Figure 4:
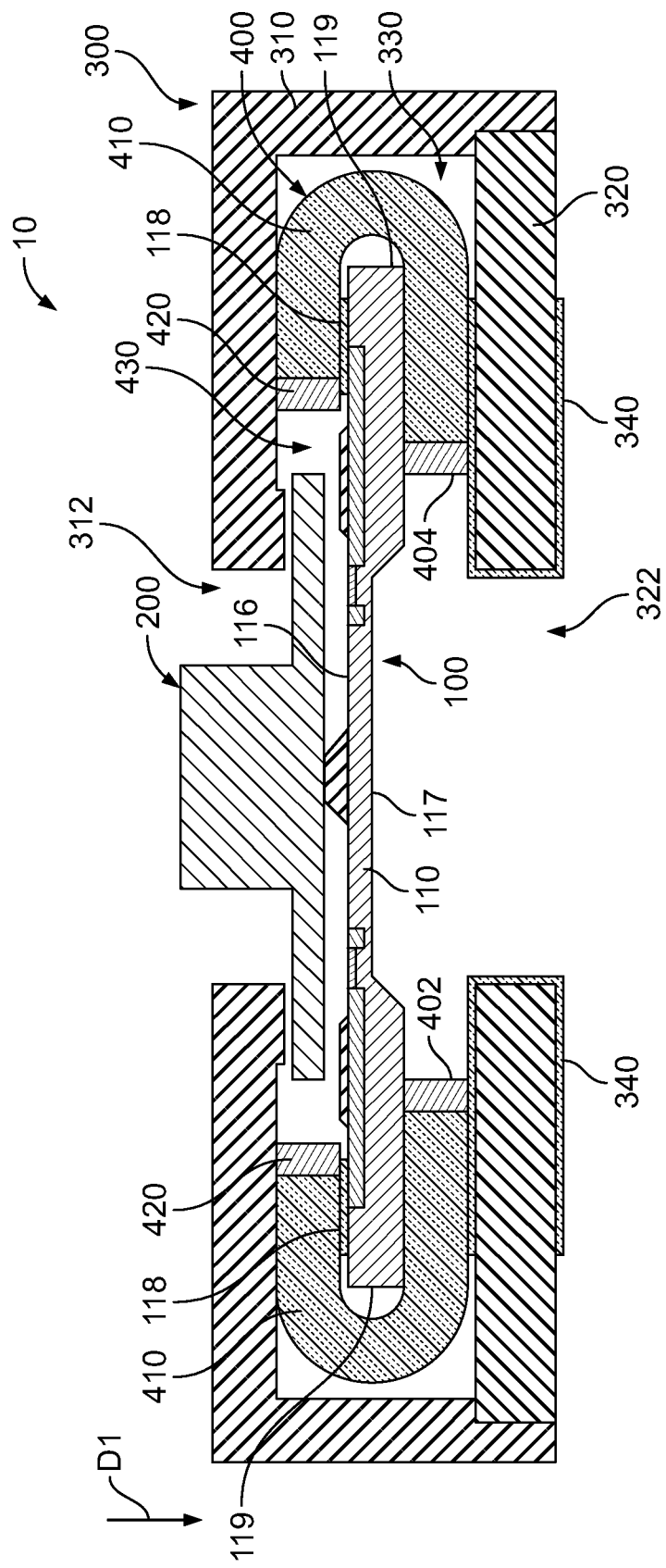
FIG. 4 is a sectional side view of a sensor package according to an embodiment.

A sensor package 10 according to an embodiment, as shown in FIG. 4, comprises the sensor assembly 100, the actuation element 200, a housing 300 containing the sensor assembly 100 and the actuation element 200, and an elastomer 400 disposed within the housing 300.

The housing 300, as shown in FIG. 4, includes a top portion 310 and a bottom portion 320 that fit together to define a receiving space 330. The top portion 310 and the bottom portion 320 are each formed of an insulative material. The top portion 310 has a top passageway 312 extending through the top portion 310 and the bottom portion 320 has a bottom passageway 322 extending through the bottom portion 320.

The housing 300, as shown in FIG. 4, includes an electrical contact 340 formed of a conductive material and disposed on a portion of the housing 300. In the shown embodiment, the electrical contact 340 is positioned on the bottom portion 320 and extends from an inner surface of the bottom portion 320 adjacent the receiving space 330, along a surface of the bottom passageway 322, and to an exterior surface of the bottom portion 320 opposite the receiving space 330.

Figure 5:
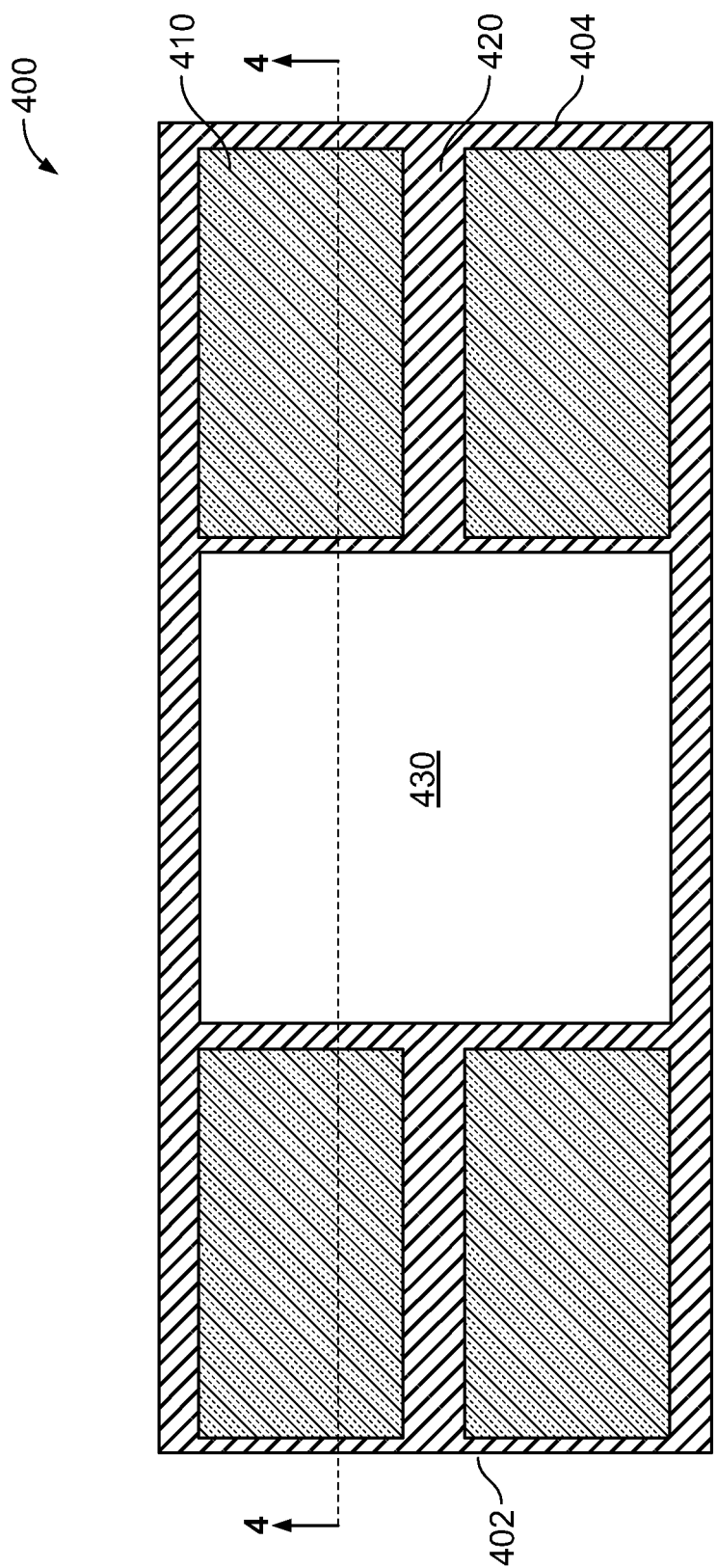
FIG. 5 is a top view of an elastomer of the sensor package of FIG. 4.

The elastomer 400, as shown in FIGS. 4 and 5, is formed of an elastic material and includes a conductive portion 410 and a non-conductive portion 420. In an embodiment, the conductive portion 410 and the non-conductive portion 420 are each formed of a biocompatible material. In the shown embodiment, the non-conductive portion 420 is formed of a polydimethylsiloxane (PDMS) and the conductive portion 410 is formed of the PDMS with a conductive composite, such as a carbon nanopowder, dispersed within the PDMS. A conductivity of the conductive portion 410 can be adjusted by changing a percentage of the conductive composite within the PDMS.

As shown in the embodiment of FIGS. 4 and 5, the elastomer 400 is an elongated rectangular member extending from a first end 402 to a second end 404 and having an elastomer passageway 430 extending approximately centrally through the elastomer 400. A plurality of conductive portions 410 are partially surrounded by the nonconductive portion 420 and are disposed on opposite sides of the elastomer passageway 430. The elastomer 400 is shown in a top view in FIG. 5 and the broken line 4-4 indicates the section of the elastomer 400 shown in FIG. 4.

As shown in FIG. 4, the sensor assembly 100, the actuation element 200, and the elastomer 400 are positioned within the receiving space 330 of the housing 300 to form the sensor package 10.

In the embodiment shown in FIG. 4, the elastomer 400 is folded around the sensor assembly 100 with a portion of the elastomer 400 adjacent the elastomer passageway 430 disposed between the surface 116 of the sensor 110 and the top portion 310 of the housing 300, the first end 402 and the second end 404 disposed between the bottom 117 of the sensor 110 and the bottom portion 320 of the housing 300, and a portion of the elastomer 400 disposed between the sides 119 of the sensor 110 and the top portion 310 of the housing 300. The receiving space 330 is sized such that the elastomer 400 is compressed within the housing 300 and elastically bears upon the sensor assembly 100 to secure the sensor assembly 100 in the receiving space 330. The conductive portion 410 of the elastomer 400 abuts the electrical pad 118 and the electrical contact 340 and electrically connects the electrical pad 118 to the electrical contact 340.

As shown in FIG. 4, the actuation element 200 is positioned within the top passageway 312 and the elastomer passageway 430 and is movable within the top passageway 312 and the elastomer passageway 430 along the deflection direction D1 to deflect the central region 112, as described in detail above with reference to FIGS. 2 and 3. The differential voltage output through the electrical pad 118 that corresponds to the deflection of the central region 112 is transmitted through the conductive portion 410 and through the electrical contact 340 to an element exterior of the sensor package 10.

Figure 6:
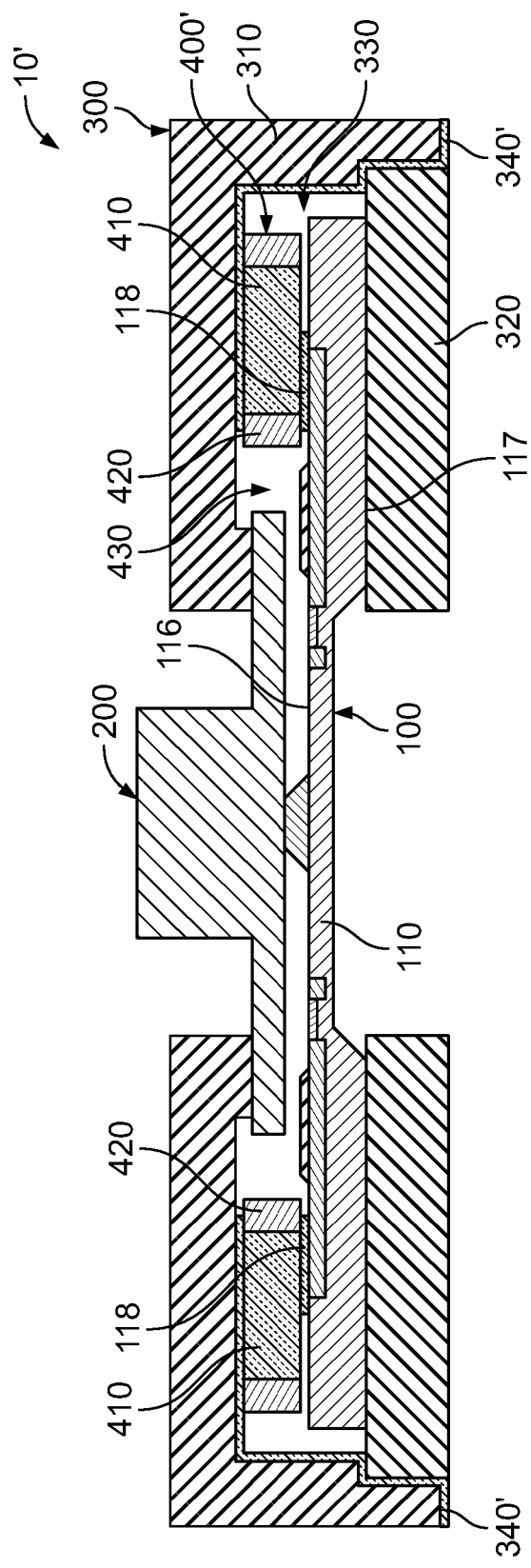
FIG. 6 is a sectional side view of a sensor package according to another embodiment.

A sensor package 10' according to another embodiment is shown in FIG. 6. Like reference numbers refer to like elements and only the differences with respect to the sensor package 10 shown in FIG. 4 will be described in detail herein.

In the sensor package 10', as shown in FIG. 6, an electrical contact 340' is positioned on the top portion 310 of the housing 300 and extends along an inner surface of the top portion 310, between the top portion 310 and the bottom portion 320, and to an exterior surface of the top portion 310.

An elastomer 400' shown in the embodiment of FIG. 6 is shorter than the elastomer 400 shown in FIGS. 4 and 5 and does not extend around the sides and bottom of the sensor 110. The elastomer 400' is positioned between the surface 116 and the top portion 310 of the housing 300 and electrically connects the electrical pad 118 to the electrical contact 340' disposed on the top portion 310 of the housing 300. The bottom 117 of the sensor 110 abuts the bottom portion 320 of the housing 300 and the compression of the elastomer 400' against the surface 116 secures the sensor assembly 100 in the receiving space 330.

Figure 7:
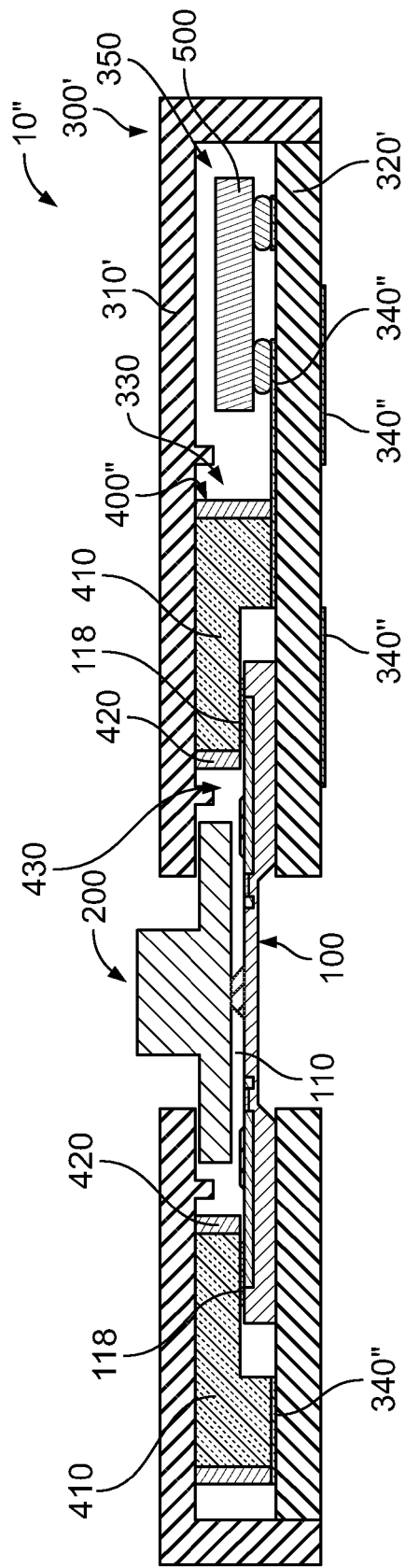
FIG. 7 is a sectional side view of a sensor package according to another embodiment.

A sensor package 10" according to another embodiment is shown in FIG. 7. Like reference numbers refer to like elements and only the differences with respect to the sensor package 10 shown in FIG. 4 will be described in detail herein.

In the sensor package 10", as shown in FIG. 7, a housing 300' includes a top portion 310' and a bottom portion 320' that fit together to define the receiving space 330 and a circuit space 350. An electrical contact 340" is positioned on an inner surface of the bottom portion 320' in both the receiving space 330 and the circuit space 350. The electrical contact 340" extends through the bottom portion 320' and is also positioned on an exterior surface of the bottom portion 320'.

An elastomer 400" shown in the embodiment of FIG. 7 has an L-shaped cross-section. The elastomer 400" is positioned between the surface 116 and the top portion 310' of the housing 300' and electrically connects the electrical pad 118 to the electrical contact 340" disposed on the bottom portion 320' of the housing 300'. The bottom 117 of the sensor 110 abuts the bottom portion 320' of the housing 300' and the compression of the elastomer 400" against the surface 116 and between the top portion 310' and the bottom portion 320' secures the sensor assembly 100 in the receiving space 330.

The sensor package 10", as shown in FIG. 7, includes an integrated circuit 500 disposed within the circuit space 350 and electrically connected to the sensor 110 through the electrical contact 340". The integrated circuit 500 receives the differential voltage output through the electrical pad 118 that corresponds to the deflection of the central region 112 and converts the voltage output to a digital signal that can be transmitted through the electrical contact 340" to an element exterior of the sensor package 10".

What is claimed is:

1. A sensor assembly, comprising:
   a sensor having a resilient central region and an outer region surrounding the central region; and
   an overload stop disposed on a surface of the sensor, the overload stop includes a center stop disposed on the central region and a peripheral stop disposed on the outer region.

2. The sensor assembly of claim 1, wherein the center stop and the peripheral stop both protrude from the surface of the sensor.

3. The sensor assembly of claim 2, wherein the center stop protrudes a first distance from the surface of the sensor and the peripheral stop protrudes a second distance from the surface of the sensor, the first distance is greater than the second distance.

4. The sensor assembly of claim 3, wherein a difference between the first distance and the second distance is less than or equal to a maximum deflection of the central region.

5. The sensor assembly of claim 1, wherein the center stop and the peripheral stop each have a rigidity greater than a rigidity of the central region.

6. The sensor assembly of claim 1, wherein the center stop is fixed on the surface of the sensor at a position of maximum deflection of the central region.

7. The sensor assembly of claim 1, wherein the sensor is a piezoresistive force sensor die.

8. A sensor package, comprising:
   a sensor assembly including a sensor and an overload stop disposed on a surface of the sensor, the sensor has a resilient central region, the overload stop includes a center stop disposed on the central region; and
   an actuation element movable between a first position and a second position, the actuation element urges the center stop during movement between the first position and the second position deflecting the central region in a deflection direction.

9. The sensor package of claim 8, wherein the sensor has an outer region surrounding the central region and the overload stop further includes a peripheral stop disposed on the outer region.

10. The sensor package of claim 9, wherein the center stop protrudes a first distance from the surface of the sensor and the peripheral stop protrudes a second distance from the surface of the sensor, the first distance is greater than the second distance.

11. The sensor package of claim 10, wherein the second position of the actuation element corresponds to a maximum deflection of the central region, the actuation element contacts the center stop and the peripheral stop in the second position.

12. The sensor package of claim 8, further comprising a housing containing the sensor assembly and an elastomer disposed between the sensor assembly and the housing.

13. The sensor package of claim 12, wherein the elastomer has a conductive portion and a non-conductive portion.

14. The sensor package of claim 13, wherein the conductive portion and the non-conductive portion of the elastomer are each formed of a biocompatible material.

15. The sensor package of claim 14, wherein the non-conductive portion of the elastomer is formed of a polydimethylsiloxane and the conductive portion of the elastomer is formed of the polydimethylsiloxane with a conductive composite dispersed within the polydimethylsiloxane.

16. The sensor package of claim 13, wherein the conductive portion of the elastomer electrically connects an electrical pad of the sensor with an electrical contact disposed on the housing.

17. The sensor package of claim 12, wherein the elastomer is disposed between the surface of the sensor and the housing and between a side of the sensor and the housing.

18. The sensor package of claim 17, wherein the elastomer is disposed between a bottom of the sensor and the housing.

19. The sensor package of claim 12, further comprising an integrated circuit disposed within the housing and electrically connected to the sensor.

20. A method of forming a sensor assembly, comprising:
providing a sensor having a central region adapted to resiliently deflect and an outer region surrounding the central region; and
depositing an overload stop on a surface of the sensor, the overload stop includes a center stop disposed on the central region and a peripheral stop disposed on the outer region.

21. The method of claim 20, wherein the depositing step forms each of the center stop and the peripheral stop as a plurality of film layers on the surface of the sensor.

22. The method of claim 21, wherein the center stop protrudes a first distance from the surface of the sensor and the peripheral stop protrudes a second distance from the surface of the sensor, the first distance is greater than the second distance.

\* \* \* \* \*